(12) United States Patent  (10) Patent No.: US 8,274,765 B2
Fuke et al.  (45) Date of Patent: Sep. 25, 2012

(54) METHOD OF MANUFACTURING MAGNETORESISTIVE ELEMENT, MAGNETORESISTIVE ELEMENT, MAGNETIC HEAD ASSEMBLY AND MAGNETIC RECORDING APPARATUS

(75) Inventors: Hiromi Fuke, Yokohama (JP); Susumu Hashimoto, Tokyo (JP); Masayuki Takagishi, Kunitachi (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 280 days.

(21) Appl. No.: 12/585,623

(22) Filed: Sep. 18, 2009

(65) Prior Publication Data
US 2010/0079918 A1  Apr. 1, 2010

(30) Foreign Application Priority Data
Sep. 29, 2008 (JP) ................. 2008-249977

(51) Int. Cl.
*G11B 5/39* (2006.01)
(52) U.S. Cl. .................................................. 360/324.1
(58) Field of Classification Search .......... None
See application file for complete search history.

(56) References Cited

U.S. PATENT DOCUMENTS

| 5,304,975 | A | 4/1994 | Saito et al. |
|---|---|---|---|
| 5,313,186 | A | 5/1994 | Schuhl et al. |
| 5,448,515 | A | 9/1995 | Fukami et al. |
| 5,459,687 | A | 10/1995 | Sakakima et al. |
| 5,549,978 | A | 8/1996 | Iwasaki et al. |
| 5,668,688 | A | 9/1997 | Dykes et al. |
| 5,715,121 | A | 2/1998 | Sakakima et al. |
| 5,768,181 | A | 6/1998 | Zhu et al. |
| 5,768,183 | A | 6/1998 | Zhu et al. |
| 5,777,542 | A | 7/1998 | Ohsawa et al. |
| 5,900,324 | A | 5/1999 | Moroishi et al. |
| 5,923,504 | A | 7/1999 | Araki et al. |
| 5,936,402 | A | 8/1999 | Schep et al. |
| 5,949,622 | A | 9/1999 | Kamiguchi et al. |
| 5,962,080 | A | 10/1999 | Tan et al. |
| 6,002,553 | A | 12/1999 | Stearns et al. |

(Continued)

FOREIGN PATENT DOCUMENTS

CN  1431651  7/2003

(Continued)

OTHER PUBLICATIONS

S. Sanvito, et al. "Breakdown of the Resistor Model of CPP-GMR in Magnetic Multilayered Nanostructures", Physical Review B, vol. 61, No. 20, May 15, 2000, pp. 14225-14228. (Abstract).

(Continued)

*Primary Examiner* — Mark Blouin
(74) *Attorney, Agent, or Firm* — Nixon & Vanderhye, P.C.

(57) ABSTRACT

A method of manufacturing a magnetoresistive element includes forming a metal layer on a first ferromagnetic layer, oxidizing the metal layer to form an oxide layer in which unoxidized metal is remained and a magnetic conduction column penetrating the oxide layer in a thickness direction and including at least a part of constituent elements of the first ferromagnetic layer, annealing a resultant structure at a higher temperature than a temperature at which the oxide layer is formed to convert at least a part of a periphery of the magnetic conduction column into a magnetic oxide including a part of constituent elements of the oxide layer and at least a part of constituent elements of the magnetic conduction column, and forming a second ferromagnetic layer.

10 Claims, 6 Drawing Sheets

U.S. PATENT DOCUMENTS

| | | |
|---|---|---|
| 6,013,365 A | 1/2000 | Dieny et al. |
| 6,016,241 A | 1/2000 | Coffey et al. |
| 6,033,584 A | 3/2000 | Ngo et al. |
| 6,074,743 A | 6/2000 | Araki et al. |
| 6,096,434 A | 8/2000 | Yano et al. |
| 6,114,056 A | 9/2000 | Inomata et al. |
| 6,117,569 A | 9/2000 | Lin et al. |
| 6,127,045 A | 10/2000 | Gill |
| 6,132,892 A | 10/2000 | Yoshikawa et al. |
| 6,159,593 A | 12/2000 | Iwasaki et al. |
| 6,205,008 B1 | 3/2001 | Gijs et al. |
| 6,219,275 B1 | 4/2001 | Nishimura |
| 6,275,363 B1 | 8/2001 | Gill |
| 6,303,218 B1 | 10/2001 | Kamiguchi et al. |
| 6,313,973 B1 | 11/2001 | Fuke et al. |
| 6,330,137 B1 | 12/2001 | Knapp et al. |
| 6,340,533 B1 | 1/2002 | Ueno et al. |
| 6,348,274 B1 | 2/2002 | Kamiguchi et al. |
| 6,353,318 B1 | 3/2002 | Sin et al. |
| 6,368,706 B1 | 4/2002 | Iwasaki et al. |
| 6,400,537 B2 | 6/2002 | Sakakima et al. |
| 6,452,763 B1 | 9/2002 | Gill |
| 6,469,926 B1 | 10/2002 | Chen |
| 6,473,275 B1 | 10/2002 | Gill |
| 6,495,275 B2 | 12/2002 | Kamiguchi et al. |
| 6,517,896 B1 | 2/2003 | Horng et al. |
| 6,519,123 B1 | 2/2003 | Sugawara et al. |
| 6,522,507 B1 | 2/2003 | Horng et al. |
| 6,556,390 B1 | 4/2003 | Mao et al. |
| 6,567,246 B1 | 5/2003 | Sakakima et al. |
| 6,603,642 B1 | 8/2003 | Arki et al. |
| 6,636,391 B2 | 10/2003 | Watanabe et al. |
| 6,674,615 B2 | 1/2004 | Hayashi |
| 6,686,068 B2 | 2/2004 | Carey et al. |
| 6,690,163 B1 | 2/2004 | Hoshiya et al. |
| 6,710,984 B1 | 3/2004 | Yuasa et al. |
| 6,720,036 B2 | 4/2004 | Tsunekawa et al. |
| 6,759,120 B2 | 7/2004 | Jangill et al. |
| 6,767,655 B2 | 7/2004 | Hiramoto et al. |
| 6,770,382 B1 | 8/2004 | Chang et al. |
| 6,853,520 B2 | 2/2005 | Fukuzawa et al. |
| 6,882,509 B2 | 4/2005 | Chang et al. |
| 6,903,907 B2 | 6/2005 | Hasegawa |
| 6,905,780 B2 | 6/2005 | Yuasa et al. |
| 6,929,957 B2 | 8/2005 | Min et al. |
| 6,937,446 B2 | 8/2005 | Kamiguchi et al. |
| 6,937,447 B2 | 8/2005 | Okuno et al. |
| 7,038,893 B2 | 5/2006 | Koui et al. |
| 7,046,489 B2 | 5/2006 | Kamiguchi et al. |
| 7,116,529 B2 | 10/2006 | Yoshikawa et al. |
| 7,163,755 B2 | 1/2007 | Hiramoto et al. |
| 7,177,121 B2 | 2/2007 | Kojima et al. |
| 7,196,877 B2 | 3/2007 | Yoshikawa et al. |
| 7,218,484 B2 | 5/2007 | Hashimoto et al. |
| 7,223,485 B2 | 5/2007 | Yuasa et al. |
| 7,240,419 B2 | 7/2007 | Okuno et al. |
| 7,301,733 B1 | 11/2007 | Fukuzawa et al. |
| 7,304,825 B2 | 12/2007 | Funayama et al. |
| 7,331,100 B2 | 2/2008 | Li et al. |
| 7,372,672 B2 | 5/2008 | Nishiyama |
| 7,379,278 B2 | 5/2008 | Koui et al. |
| 7,390,529 B2 | 6/2008 | Li et al. |
| 7,476,414 B2 | 1/2009 | Fukuzawa et al. |
| 7,514,117 B2 | 4/2009 | Fukuzawa et al. |
| 7,522,390 B2 * | 4/2009 | Yuasa et al. ............ 360/324.1 |
| 7,525,776 B2 * | 4/2009 | Fukuzawa et al. ....... 360/324.12 |
| 7,602,592 B2 | 10/2009 | Fukuzawa et al. |
| 7,610,674 B2 | 11/2009 | Zhang et al. |
| 7,776,387 B2 | 8/2010 | Fuji et al. |
| 7,785,662 B2 | 8/2010 | Fuji et al. |
| 2001/0005300 A1 | 6/2001 | Hayashi |
| 2001/0009063 A1 | 7/2001 | Saito et al. |
| 2001/0014000 A1 | 8/2001 | Tanaka et al. |
| 2001/0040781 A1 | 11/2001 | Tanaka et al. |
| 2002/0048127 A1 | 4/2002 | Fukuzawa et al. |
| 2002/0048128 A1 | 4/2002 | Kamiguchi et al. |
| 2002/0051380 A1 | 5/2002 | Kamiguchi et al. |
| 2002/0054461 A1 | 5/2002 | Fujiwara et al. |
| 2002/0058158 A1 | 5/2002 | Odagawa et al. |
| 2002/0073785 A1 | 6/2002 | Prakash et al. |
| 2002/0114974 A1 | 8/2002 | Carey et al. |
| 2002/0135935 A1 | 9/2002 | Covington |
| 2002/0145835 A1 | 10/2002 | Suzuki et al. |
| 2002/0150791 A1 | 10/2002 | Yuasa et al. |
| 2002/0159201 A1 | 10/2002 | Li et al. |
| 2002/0191355 A1 | 12/2002 | Hiramoto et al. |
| 2003/0011463 A1 | 1/2003 | Iwasaki et al. |
| 2003/0026049 A1 | 2/2003 | Gill |
| 2003/0035256 A1 | 2/2003 | Hayashi et al. |
| 2003/0049389 A1 | 3/2003 | Tsunekawa et al. |
| 2003/0053269 A1 | 3/2003 | Nishiyama |
| 2003/0099868 A1 | 5/2003 | Tanahashi et al. |
| 2003/0104249 A1 | 6/2003 | Okuno et al. |
| 2003/0123200 A1 | 7/2003 | Nagasaka et al. |
| 2003/0128481 A1 | 7/2003 | Seyama et al. |
| 2003/0156360 A1 | 8/2003 | Kawawake et al. |
| 2004/0021990 A1 | 2/2004 | Koui et al. |
| 2004/0121185 A1 | 6/2004 | Fukuzawa et al. |
| 2004/0137645 A1 | 7/2004 | Hu et al. |
| 2004/0150922 A1 | 8/2004 | Kagami et al. |
| 2004/0169963 A1 | 9/2004 | Okuno et al. |
| 2004/0201929 A1 | 10/2004 | Hashimoto et al. |
| 2004/0206619 A1 | 10/2004 | Pinarbasi |
| 2004/0246631 A1 | 12/2004 | Dieny et al. |
| 2005/0042478 A1 | 2/2005 | Okuno et al. |
| 2005/0068855 A1 | 3/2005 | Morikawa et al. |
| 2005/0073778 A1 | 4/2005 | Hasegawa et al. |
| 2005/0094317 A1 | 5/2005 | Funayama |
| 2005/0094322 A1 | 5/2005 | Fukuzawa et al. |
| 2005/0094327 A1 | 5/2005 | Okuno et al. |
| 2005/0141148 A1 | 6/2005 | Aikawa et al. |
| 2005/0276998 A1 | 12/2005 | Sato |
| 2006/0002184 A1 | 1/2006 | Hong et al. |
| 2006/0018057 A1 | 1/2006 | Huai |
| 2006/0034022 A1 | 2/2006 | Fukuzawa et al. |
| 2006/0050444 A1 | 3/2006 | Fukuzawa et al. |
| 2006/0098353 A1 | 5/2006 | Fukuzawa et al. |
| 2006/0114620 A1 | 6/2006 | Sbiaa et al. |
| 2006/0164764 A1 | 7/2006 | Kamiguchi et al. |
| 2007/0070556 A1 | 3/2007 | Zhang et al. |
| 2007/0081276 A1 | 4/2007 | Fukuzawa et al. |
| 2007/0092639 A1 | 4/2007 | Fuji et al. |
| 2007/0159733 A1 | 7/2007 | Hashimoto et al. |
| 2007/0172690 A1 | 7/2007 | Kim et al. |
| 2007/0188936 A1 | 8/2007 | Zhang et al. |
| 2007/0188937 A1 | 8/2007 | Carey et al. |
| 2007/0202249 A1 | 8/2007 | Yuasa et al. |
| 2007/0253122 A1 | 11/2007 | Fukuzawa et al. |
| 2007/0259213 A1 | 11/2007 | Hashimoto et al. |
| 2008/0005891 A1 | 1/2008 | Yuasa et al. |
| 2008/0008909 A1 | 1/2008 | Fuji et al. |
| 2008/0013218 A1 | 1/2008 | Fuke et al. |
| 2008/0062577 A1 | 3/2008 | Fukuzawa et al. |
| 2008/0068764 A1 | 3/2008 | Fukuzawa et al. |
| 2008/0080098 A1 | 4/2008 | Fuke et al. |
| 2008/0102315 A1 | 5/2008 | Fukuzawa et al. |
| 2008/0192388 A1 | 8/2008 | Zhang et al. |
| 2008/0204944 A1 | 8/2008 | Aikawa et al. |
| 2008/0239590 A1 | 10/2008 | Fuke et al. |
| 2008/0278864 A1 | 11/2008 | Zhang et al. |
| 2009/0059441 A1 | 3/2009 | Zhang et al. |
| 2009/0061105 A1 | 3/2009 | Fukuzawa et al. |
| 2009/0091864 A1 | 4/2009 | Carey et al. |
| 2009/0091865 A1 | 4/2009 | Zhang et al. |
| 2009/0104475 A1 | 4/2009 | Fuji et al. |
| 2009/0109581 A1 | 4/2009 | Fukuzawa et al. |
| 2009/0141408 A1 | 6/2009 | Fukuzawa et al. |
| 2009/0162698 A1 | 6/2009 | Fukuzawa et al. |
| 2009/0225477 A1 | 9/2009 | Fukuzawa et al. |
| 2010/0037453 A1 | 2/2010 | Zhang et al. |
| 2010/0091412 A1 | 4/2010 | Yuasa et al. |
| 2010/0091414 A1 | 4/2010 | Yuasa et al. |
| 2010/0091415 A1 | 4/2010 | Yuasa et al. |
| 2010/0092803 A1 | 4/2010 | Yuasa et al. |

FOREIGN PATENT DOCUMENTS

| | | |
|---|---|---|
| CN | 1183517 | 1/2005 |
| CN | 1746980 | 3/2006 |
| EP | 0 687 917 | 12/1995 |
| EP | 0 877 398 | 11/1998 |
| EP | 1 328 027 | 7/2003 |
| EP | 1 400 957 | 3/2004 |
| EP | 1 548 762 | 6/2005 |
| EP | 1 607 941 | 12/2005 |
| EP | 1 626 393 | 2/2006 |
| GB | 2 390 168 | 12/2003 |
| JP | 08-049063 | 2/1996 |
| JP | 09-116212 | 5/1997 |
| JP | 09-306733 | 11/1997 |
| JP | 10-173252 | 6/1998 |
| JP | 10-324969 | 12/1998 |
| JP | 11-121832 | 4/1999 |
| JP | 11-154609 | 6/1999 |
| JP | 11-238923 | 8/1999 |
| JP | 11-296820 | 10/1999 |
| JP | 2000-137906 | 5/2000 |
| JP | 2000-156530 | 6/2000 |
| JP | 2000-188435 | 7/2000 |
| JP | 2000-215414 | 8/2000 |
| JP | 2000-228004 | 8/2000 |
| JP | 2000-293982 | 10/2000 |
| JP | 2001-094173 | 4/2001 |
| JP | 2001-143227 | 5/2001 |
| JP | 2001-176027 | 6/2001 |
| JP | 2001-229511 | 8/2001 |
| JP | 2001-237471 | 8/2001 |
| JP | 2001-358380 | 12/2001 |
| JP | 2002-076473 | 3/2002 |
| JP | 2002-124721 | 4/2002 |
| JP | 2002-150512 | 5/2002 |
| JP | 2002-204010 | 7/2002 |
| JP | 2002-208744 | 7/2002 |
| JP | 2003-086866 | 3/2003 |
| JP | 2003-110168 | 4/2003 |
| JP | 2003-152243 | 5/2003 |
| JP | 2003-204095 | 7/2003 |
| JP | 2004-006589 | 1/2004 |
| JP | 2004-153248 | 5/2004 |
| JP | 2004-214234 | 7/2004 |
| JP | 2005-097693 | 4/2005 |
| JP | 2005-136309 | 5/2005 |
| JP | 2005-166896 | 6/2005 |
| JP | 2005-339784 | 12/2005 |
| JP | 2005-353236 | 12/2005 |
| JP | 2006-019743 | 1/2006 |
| JP | 2006-049426 | 2/2006 |
| JP | 2006-054257 | 2/2006 |
| JP | 2006-114610 | 4/2006 |
| JP | 2006-135253 | 5/2006 |
| JP | 2006-319343 | 11/2006 |
| JP | 2007-221135 | 8/2007 |
| KR | 10-0302029 | 6/2001 |
| KR | 2001-0081971 | 8/2001 |
| KR | 2002-0015295 | 2/2002 |
| KR | 10-2005-0027159 | 3/2005 |
| KR | 10-2005-0118649 | 12/2005 |
| KR | 10-2006-0050327 | 5/2006 |
| WO | 97/47982 | 12/1997 |
| WO | 03/032338 | 4/2003 |

OTHER PUBLICATIONS

Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317. (Abstract).

B. Dieny, et al., "Magnetotransport Properties of Magnetically Soft Spin-Valve Structures (Invited)", J. Appl. Phys., vol. 69 (8), Apr. 15, 1991, pp. 4774-4779.

B. Dieny et al., "Giant Magnetoresistance of Magnetically Soft Sandwiches: Dependence on Temperature and on Layer Thicknesses", Physical Review B, vol. 45, No. 2, Jan. 1, 1992, pp. 806-813.

D. Bozec, et al., "Comparative Study of the Magnetoresistance of MBE-Grown Multilayers: [Fe/Cu/Co/Cu]$_N$ and [Fe/Cu]$_N$ [Co/Cu]$_N$" Physical Review B, vol. 60, No. 5, Aug. 1, 1999, pp. 3037-3039. (Abstract).

Hideaki Fukuzawa, et al., "MR Ratio Enhancement by NOL Current-Confined-Path Structures in CPP Spin Valves", IEEE Transactions on Magnetics, Jul. 2004, vol. 40, No. 4, pp. 2236-2238.

Takagishi, M. et al., "The Applicability of CPP-GMR Heads for Magnetic Recording", IEEE Transactions on Magnetics, vol. 38, No. 5, pp. 2277-2282, (Sep. 2002).

A. Losev et al., "Electron Beam Induced Reduction Ofof CuO in the Presence of a Surface Carbonaceous Layer: An XPS/Hreels Study", Surface Science 213 (1989) pp. 554-579.

K.S. Kim et al., "X-Ray Photoelectron Spectroscopic Studies of Nickel-Oxygen Surfaces Using Oxygen and Argon Ion-Bombardment", Surface Science 43 (1974), pp. 625-643.

J.J. Versluijs, et al., "Magnetoresistance of Half-Metallic Oxide Nanocontracts," Physical Review Letters, vol. 87, No. 2, Jul. 9, 2001, pp. 026601-1 through 026601-4.

W.F. Egelhoff, et al., "Oxygen as a Surfactant in the Growth of Giant Magnetoresistance Spin Valves", J Appl. Phys., vol. 82, No. 12, pp. 6142-6151, Dec. 15, 1997.

Y. Kamiguchi et al., "CoFe Specular Spin Valves With a Nano Oxide Layer", The 1999 IEEE International Magnetics Conference, May 18-21, 1999.

H.A. Ferrera et al. "Rapid DNA hybridization based on ac field focusing of magnetically labeled target DNA"; Applied Physics Letters, 87, 013901 (2005); pp. 013901-1 to 013901-3.

L. Lagae et al. "Magnetic biosensors for genetic screening of cystic fibrosis"; IEE Proc. Circuits Devices Syst. vol. 152, No. 4, Aug. 2005, pp. 393-400.

Meguro, K., Hoshiya, H., Watanabe, K., Hamakawa, Y., and Fuyama, M., "Spin-valve films using syntehtic ferrimagnets for pinned layer," (IEEE Trans. Mag., 35(5), 1999, 2925-2927. (Abstract).

C. Vouille et al, J.Appl.Phys. 81 4573 (1997); "Inverse CPP-GMR in (A/Cu/Co/Cu) multilayers . . . by impurities" (Abstract).

A.C. Reilly et al, J.Magn. Magn. Mater, 195 (1999) L269; "Perpendicular giant magnetoresistance of . . . unified picture." (Abstract).

J. Bass et al, J. Magn. Magn. Mater, 200 (1999) 274; "Current-perpendicular (CPP) magnetoresistance in magnetic metallic multilayers." (Abstract).

L. Villa, et al., Journal of Applied Physics, vol. 87, No. 12, pp. 8610-8614, Current Perpendicular Magnetoresistances of NiFeCo and NiFe "Permalloys", Jun. 15, 2000. (Abstract).

Yonsei University Master Thesis, "Voltage Difference Amplification Circuit for Improving the Sensing Characteristics of MRAM", Dec. 2005 and brief English-language translation thereof.

Ceramist vol. 4 No. 5, Special Edition, "Magnetic Sensor Technologies and Applications Using Giant Magnetoresistance effect", Oct. 2001.

Seoul University Doctoral Thesis, A Study on the Development of New Spin Wave Structures for Magnetoresistive RAM based on Giant Magnetoresistance and Tunneling, Aug. 2001 and brief English-language translation thereof.

Nagasaka et al., "Giant magnetoresistance properties of specular spin valve films in a current perpendicular to plane structure," J. Appl. Phys., vol. 89, No. 11, pp. 6943-4965.

Mazin, "How to Define and Calculate the Degree of Spin Polarization in Ferromagnets", Physical Review Letters, vol. 83, No. 7, Aug. 16, 1999, pp. 1427-1430.

Fuke et al., U.S. Appl. No. 12/071,589, filed Feb. 22, 2008.

Fukuzawa et al., U.S. Appl. No. 12/086,761, filed Jun. 19, 2008.

Office Action dated Sep. 21, 2010 in Japanese Application No. 2008-249977 and English-language translation thereof.

U.S. Appl. No. 12/071,589, filed Feb. 22, 2008.

U.S. Appl. No. 12/086,761, filed Jul. 19, 2008.

Garcia et al., Magnetoresistive in excess of 200% in Ballistic Ni Nanocontacts at Room Temperature and 100 OE, *The American Physical Society*, 1999, pp. 2923-2926.

\* cited by examiner

■ : Cooling in field of +10 kOe
● : Cooling at zero field

F I G. 8

METHOD OF MANUFACTURING MAGNETORESISTIVE ELEMENT, MAGNETORESISTIVE ELEMENT, MAGNETIC HEAD ASSEMBLY AND MAGNETIC RECORDING APPARATUS

CROSS-REFERENCE TO RELATED APPLICATIONS

This application is based upon and claims the benefit of priority from prior Japanese Patent Application No. 2008-249977, filed Sep. 29, 2008, the entire contents of which are incorporated herein by reference.

BACKGROUND OF THE INVENTION

1. Field of the Invention

The present invention relates to a method of manufacturing a magnetoresistive element having such a structure that a current is supplied in a direction perpendicular to the film plane, a magnetoresistive element manufactured by the method, a magnetic head assembly using the magnetoresistive element and magnetic recording apparatus using the magnetic head assembly.

2. Description of the Related Art

The performance of magnetic devices has been drastically improved by finding of the giant magnetoresistive effect (GMR) in a stacked structure of magnetic materials. In particular, since a spin-valve film (SV film) has a structure easily applicable to magnetic devices and efficiently exhibits the GMR effect, it has brought about marked technical improvement in the magnetic devices such as magnetic head assemblies and magnetic random access memories (MRAMs).

The "spin-valve film" has a structure in which a nonmagnetic metal spacer layer is sandwiched between two ferromagnetic layers. In the spin-valve film, the magnetization of one ferromagnetic layer (referred to as a "pinned layer" or "magnetization pinned layer") is pinned by an anti-ferromagnetic layer or the like, whereas the magnetization of the other ferromagnetic layer (referred to as a "free layer" or "magnetization free layer") is made rotatable in accordance with an external magnetic field. In the spin-valve film, a giant magnetoresistance change can be produced by a change of the relative angle between the magnetization directions of the pinned layer and the free layer.

Conventional spin-valve films are CIP (current-in-plane)-GMR element in which a sense current is supplied in parallel to the film plane. In recent years, TMR (tunneling magnetoresistance) elements and CPP (current-perpendicular-to-plane)-GMR elements, in which a sense current is supplied in a direction substantially perpendicular to the film plane, attract a great deal of attention because they exhibit a higher MR ratio than the CIP-GMR element.

On the other hand, there has been observed that a nanocontact between Ni wires exhibits a magnetoresistance effect with a high magnetoresistance change. See, Phys. Rev. Lett., 82, 2923 (1999).

Further, development of a magnetoresistive element in which the magnetic nanocontact is extended to a three-dimensional structure has been advanced. See, JP-A 2003-204095 (KOKAI). JP-A 2003-204095 (KOKAI) discloses, as a method of fabricating a nanocontact, more specifically as a method of forming a hole for the nanocontact, an electron beam (EB) irradiation process, a focused ion beam (FIB) irradiation process, atomic force microscope (AFM) technology and the like.

It is conceivable that the novel magnetoresistive effect described in the above documents may be derived from abrupt change of magnetization at the magnetic nanocontact. The abrupt change of magnetization at the magnetic nanocontact depends on a domain wall thickness or a domain wall width produced at the magnetic nanocontact. In other words, the abrupt change can be provided as the domain wall width is made narrower. In addition, since the domain wall width depends on a size of the magnetic nanocontact, it is preferable that the magnetic nanocontact has a small size. Further, it is preferable that the magnetic nanocontact or the domain wall has high purity of magnetic element. However, it is very difficult to form a magnetic nanocontact with a small size and high purity.

BRIEF SUMMARY OF THE INVENTION

According to an aspect of the present invention, there is provided a method of manufacturing a magnetoresistive element comprising: forming a metal layer on a first ferromagnetic layer; oxidizing the metal layer to form an oxide layer in which unoxidized metal is remained and a magnetic conduction column penetrating the oxide layer in a thickness direction and comprising at least a part of constituent elements of the first ferromagnetic layer; annealing a resultant structure at a higher temperature than a temperature at which the oxide layer is formed to convert at least a part of a periphery of the magnetic conduction column into a magnetic oxide comprising a part of constituent elements of the oxide layer and at least a part of constituent elements of the magnetic conduction column, so as to form the intermediate layer comprising the oxide layer, magnetic conduction column and magnetic oxide; and forming a second ferromagnetic layer on the intermediate layer. Also, there is provided a method of manufacturing a magnetoresistive element comprising: forming a metal layer on a first ferromagnetic layer; oxidizing the metal layer to form an oxide layer in which unoxidized metal is remained and a magnetic conduction column penetrating the oxide layer in a thickness direction and comprising at least a part of constituent elements of the first ferromagnetic layer; forming a second ferromagnetic layer; annealing resultant structure at a higher temperature than a temperature at which the oxide layer is formed to convert at least a part of a periphery of the magnetic conduction column into a magnetic oxide comprising a part of constituent elements of the oxide layer, at least a part of constituent elements of the magnetic conduction column and at least a part of constituent elements of the second ferromagnetic layer, so as to form the intermediate layer comprising the oxide layer, magnetic conduction column and magnetic oxide.

According to another aspect of the present invention, there is provided a magnetoresistive element comprising: a stacked film comprising first and second ferromagnetic layers a magnetization direction of one of which ferromagnetic layers is substantially pinned in a direction and a magnetization direction of the other of which ferromagnetic layers is varied depending on an external magnetic field, and an intermediate layer between the first and second ferromagnetic layers; and a pair of electrodes provided on a bottom and a top of the stacked film and configured to pass a current perpendicularly to a film plane of the stacked film, the intermediate layer comprising: an oxide layer; a magnetic conduction column penetrating the oxide layer in a thickness direction; and a magnetic oxide covering at least a part of a periphery of the magnetic conduction column and comprising a part of constituent elements of the oxide layer and at least a part of constituent elements of the magnetic conduction column.

DETAILED DESCRIPTION OF THE INVENTION

Hereinafter, embodiments of the invention will be described with reference to the drawings.

Figure 1:
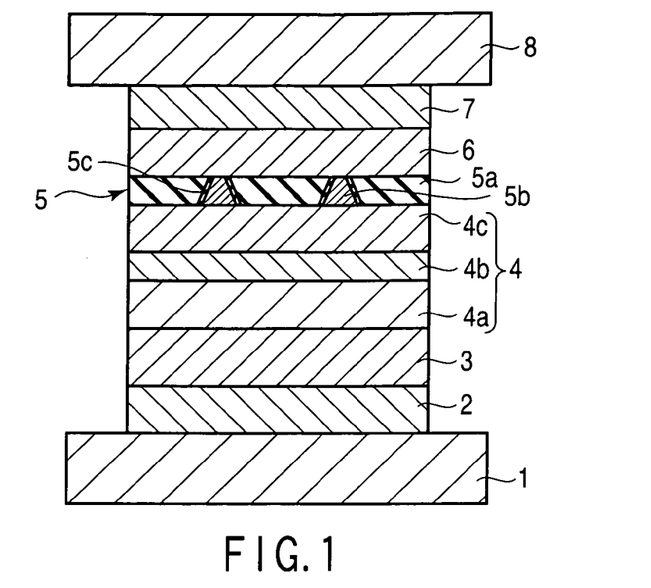
FIG. 1 is a cross-sectional view of a magnetoresistive element according to an embodiment.

FIG. 1 is a cross-sectional view of a magnetoresistive element according to an embodiment. The magnetoresistive element has a structure in which a stacked film is provided between a lower electrode (LE) 1 and an upper electrode (UE) 8.

In FIG. 1, the stacked film between the lower electrode (LE) 1 and the upper electrode (UE) 8 comprises an underlayer 2, an anti-ferromagnetic layer 3, a pinned layer (magnetization pinned layer) 4 as a first ferromagnetic layer, an intermediate layer 5, a free layer (magnetization pinned layer) 6 as a second ferromagnetic layer, and a protection layer 7.

The pinned layer 4 in FIG. 1 has a synthetic structure in which a lower pinned layer 4a and an upper pinned layer 4c are provided on the both sides of an anti-parallel coupling layer 4b. The intermediate layer 5 comprises an oxide layer 5a, a magnetic conduction column 5b penetrating the oxide layer 5a in a thickness direction, and a magnetic oxide 5c covering at least a part of the periphery of the magnetic conduction column 5b. The magnetic conduction column 5b comprises at least a part of constituent elements of the underlying first ferromagnetic layer (i.e., the pinned layer in this case) or at least a part of constituent elements of the second ferromagnetic layer (i.e., the free layer in this case). It should be note that the constituent element of the first ferromagnetic layer included in the magnetic conduction column 5b need not all the constituent elements but may be a part of the constituent elements. In addition, where a process is employed which comprises forming a metal layer on the first ferromagnetic layer, oxidizing the metal layer, forming a second ferromagnetic layer on the oxidized metal layer, and annealing the resultant structure at a higher temperature than the oxidation temperature, the magnetic conduction column 5b comprises a constituent element of the second ferromagnetic layer as well as a constituent element of the first ferromagnetic layer. It should be also note that the constituent element of the second ferromagnetic layer included in the magnetic conduction column 5b need not all the constituent elements but may be a part of the constituent elements. The magnetic oxide 5c comprises a part of constituent elements of the oxide layer 5a and at least a part of constituent elements of the magnetic conduction column 5b.

In FIG. 1, the pinned layer 4, intermediate layer 5 and free layer 6 constitute the spin-valve film.

In the magnetoresistive element, a sense current is supplied substantially perpendicular to the film plane of the stacked film via the lower electrode (LE) and upper electrode (UE), in other words, the element operates as a CPP (current-perpendicular-to-plane) magnetoresistive element.

A structure having an inverted stacked film can also be employed, in which the underlayer 2, free layer 6, intermediate layer 5, pinned layer 4 of a synthetic structure, anti-ferromagnetic layer 3 and protection layer 7 are stacked in this order from the lower electrode. In this case, the first ferromagnetic layer corresponds to the free layer 6, and the second ferromagnetic layer corresponds to the pinned layer 6 of synthetic structure.

Although the pinned layer 4 of synthetic structure is employed in FIG. 1, the pinned layer 4 may be a single-layered ferromagnetic layer. Although the single-layered free layer 4 is employed in FIG. 1, the pinned layer 4 may be of a stacked structure.

Hereinafter, each layer of the magnetoresistive element in FIG. 1 will be described in more detail.

The underlayer 2 may be a double-layered structure of a buffer layer and seed layer, for example. The buffer layer functions to alleviate roughness on the surface of the lower electrode (LE). The buffer layer may be formed of a material selected from the group consisting of Ta, Ti, W, Zr, Hf, Cr and an alloy thereof. The seed layer is a layer for controlling the crystalline orientation and the crystal grain size of the spin-valve film deposited thereon. The seed layer functions to control the crystalline orientation of the spin-valve film. The buffer layer may be formed of a material selected from the group consisting of Ru, $(Fe_xNi_{100-x})_{100-y}X_y$, where X=Cr, V, Nb, Hf, Zr or Mo, $15<x<25$, and $20<y<45$, Cr and Cu. The underlayer 2 may be formed of either the buffer layer or seed layer.

The anti-ferromagnetic layer 3 functions to impart unidirectional anisotropy to the pinned layer 4 of synthetic structure and to fix the magnetization of the pinned layer. The anti-ferromagnetic layer 3 may be formed of an anti-ferromagnetic material such as PtMn, PdPtMn, IrMn and RuRhMn. In the case of using IrMn, it is preferable to set the Ir composition in IrMn above 22 at % in view of heat resistance.

The lower pinned layer 4a and upper pinned layer 4c in the pinned layer 4 may be formed of various types of magnetic materials such as Fe, Co, Ni, a FeCo alloy, a FeNi alloy, a FeCoNi alloy, and a CoFeB alloy. Also, a half metal-based material comprising Fe, Co, or Ni may be use for the upper pinned layer 4c in addition to the above materials. Further, a material prepared by adding a non-magnetic material to the above magnetic materials may be used. The anti-parallel coupling layer 4b has a function to anti-ferromagnetically couple the lower pinned layer 4a and upper pinned layer 4c and may be formed of a material such as Ru, Ir and Rh.

The oxide layer 5a in the intermediate layer 5 may be formed of an oxide comprising at least one element selected from the group consisting of Al, Mg, Li, Si, Ca, Sc, Ti, V, Cr, Mn, Fe, Co, Ni, Cu, Zn, Ga, Se, Sr, Y, Zr, Nb, Mo, Pd, Ag, Cd, In, Sn, Sb, Ba, Ka, Hf, Ta, W, Re, Pt, Hg, Pb, Bi, and lanthanoide elements. In addition, any material having a function of insulating a current may be appropriately used for the oxide layer 5a.

The magnetic conduction column 5b in the intermediate layer 5 functions as a path to pass a current perpendicularly to the film plane and as a contact to magentically contact the pinned layer 4a and free layer 6. The magnetic conduction column 5b may be formed of a ferromagnetic material such as Fe, Co, Ni and the alloy thereof which is a constituent element of the upper pinned layer 4c in the pinned layer 4 or the free layer 6.

The magnetic oxide 5c in the intermediate layer 5 comprises a part of constituent elements of the oxide layer 5a and at least a part of constituent elements of the magnetic conduction column 5b. Although FIG. 1 shows that the magnetic oxide 5c covers the entire periphery of the magnetic conduction column 5b, the magnetic oxide 5c needs not always to cover the entire periphery and it suffices to cover a part of the periphery. However, it is preferable that the magnetic oxide 5c covers the entire periphery of the magnetic conduction column 5b in order to reduce the size of the magnetic conduction column 5b more effectively.

The free layer (magnetization free layer) 6 may be formed of a ferromagnetic material, a magnetization direction of which is varied depending on an external magnetic field, such as Fe, Co, Ni, a FeCo alloy and a FeNi alloy. Also, a half metal-based material comprising Fe, Co, or Ni may be use for the free layer 6 in addition to the above materials. Further, a material prepared by adding a non-magnetic material to the above magnetic materials may be used. Although FIG. 1 shows that the free layer 6 is a single-layered film, the free layer 6 may be of a stacked structure including plurality of layers as described above. It is not necessary that the pinned layer and free layer have the same constituent elements and composition ratio of alloy.

The protection layer 7 has a function of protecting the spin valve film. The protection layer 7 may be a single layer, a multilayer or a stacked film comprising an element selected from the group consisting of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Pt, Ni, Co, Re, V and an alloy thereof. For example, the protection layer 7 may be formed of a double-layered film of Cu/Ru or a triple-layered film of Cu/Ta/Ru.

When a magnetic field having an opposite direction to the magnetization direction of the upper pinned layer 4a is applied to the free layer 6 and the magnetization direction of the free layer 6 is directed to the direction of the above magnetic field, the magnetization directions of the upper pinned layer 4a and free layer 6 are made anti-parallel to each other. In this case, since the magnetic conduction column 5b is sandwiched between two ferromagnetic layers, i.e., the upper pinned layer 4a and free layer 6, a domain wall is produced in the magnetic conduction column 5b. In the magnetoresistive element according to the embodiment, the magnetic conduction column 5b has a narrow domain wall width, and thus, a steep magnetization change can be provided in the magnetic conduction column 5b.

Next, a method of manufacturing a magnetoresistive element shown in FIG. 1 will be described with reference to FIGS. 2A to 2C.

(1) Formation of the Lower Electrode (LE) 1, Underlayer 2 and Ferromagnetic Layer:

The lower electrode 1 is formed on a substrate (not shown) by a fine-processing technology. The underlyer 2 and ferromagnetic layer 3 are deposited in this order on the lower electrode 1.

(2) Formation of the Pinned Layer 4 of Synthetic Structure:

The lower pinned layer 4a, anti-parallel coupling layer 4b, and upper pinned layer 4c are deposited in this order on the ferromagnetic layer 3.

Figure 2A:
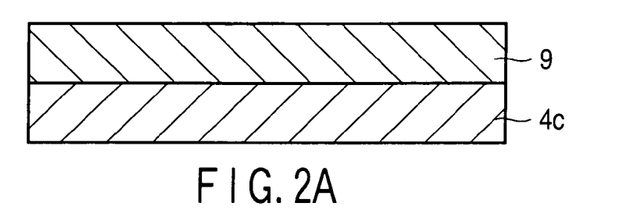
FIGS. 2A to 2C are cross-sectional views showing a method of manufacturing the magnetoresistive element shown in FIG. 1.

(3) Formation of the Intermediate Layer 5:

As shown in FIG. 2A, a metal layer 9 made of a metal such as Al to be converted into the oxide layer is deposited on the upper pinned layer 4c.

Figure 2B:
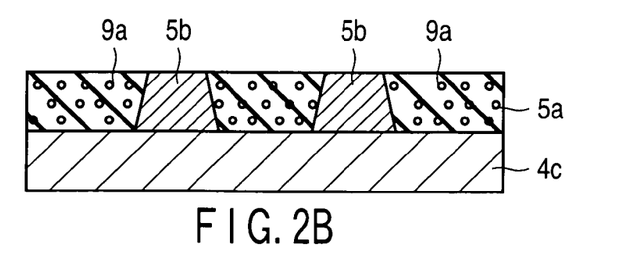

As shown in FIG. 2B, the metal layer (Al) 9 is oxidized by natural exposure, an ion-assisted method, a RF plasma method, an ion-beam method or a radical method by which the oxide layer 5a and the magnetic conduction column 5b penetrating the oxide layer 5a in the thickness direction and comprising at least a part of constituent elements of the upper pinned layer 4c are formed. At this time, it is not necessary to heat the substrate, and the oxidation can be performed at room temperature.

In the embodiment, the oxidation conditions are made more moderate compared to proper or excessive oxidation conditions under which the entire metal layer (Al) 9 is oxidized, and thus, unoxidized metal (Al) 9a is made remained in the oxide layer 5a. The more moderate oxidation conditions compared to proper or excessive oxidation conditions can be attained by reducing the oxygen flow rate, reducing the oxygen pressure, or shortening the oxidation time. The quantity of the remaining unoxidized metal can be changed by adjusting the above conditions and by adjusting the thickness of the metal layer (Al) 9.

Also, the oxide layer 5a in which unoxidized metal (Al) 9a is remained may be subjected to a RF plasma method or an ion-beam method to form the magnetic conduction column 5b.

Figure 2C:
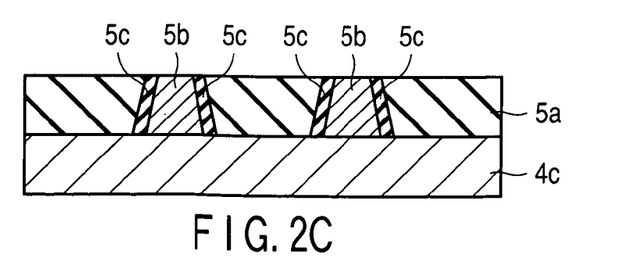

As shown in FIG. 2C, after the oxide layer 5a in which unoxidized metal (Al) 9a is remained and the magnetic conduction column 5b are formed, the resultant structure is annealed in vacuum at a higher temperature than the oxidation temperature, where the process is referred to as in-situ annealing herein, such that a part of the periphery of the magnetic conduction column 5b is converted, thereby to form the magnetic oxide 5c comprising a part of constituent elements of the oxide layer 5a and at least a part of constituent elements of the magnetic conduction column 5b. Thus, the intermediate layer 5 comprising the oxide layer 5a, magnetic conduction column 5b and magnetic oxide 5c is formed.

In the case where $Fe_{50}Co_{50}$, for example, is used for the material of the upper pinned layer 4c, FeCo, Fe, Co, FeCo-oxide and the like are present in the magnetic conduction column 5b at the end of the oxidation and a supplemental process performed if necessary for forming the magnetic conduction column 5b. When the annealing is performed in this state, the FeCo-oxide is react with the unoxidized metal (Al) to produce FeAl-oxide and Co through reduction. As a result, the magnetic conduction column 5b is highly purified in a composition mainly comprised of Co and the FeAl-oxide covers at least a part of the periphery of the magnetic conduction column 5b and reduces the size of magnetic conduction column 5b. The annealing temperature is set at a higher temperature than the oxidation temperature so as to cause above reaction. The upper limits of the annealing conditions are determined in a range of temperature and time where no diffusion is caused at the interfaces of the layers. The temperature at which the diffusion is caused at the interfaces of the layers is not specifically determined because it depends on a degree of mixing at the interfaces of the layers after deposition and surface irregularity.

It should be noted that the material of the upper pinned layer 4c is preferably made of an alloy comprising Fe which is easily oxidized and Co or Ni which is hard to be oxidized like the above example.

(4) Formation of the Free Layer 6, Protection Layer 7 and Upper Electrode (UE) 8:

The free layer 6 is deposited on the intermediate layer 5, and then the protection layer 7 and the upper electrode (UE) 8 are deposited in this order on the free layer 6. In such a manner, the magnetoresistive element can be provided.

(5) Annealing in a Magnetic Field:

The resultant magnetoresistive element is annealed in a magnetic field by which the magnetization direction of the pinned layer 4 is pinned.

Although FIGS. 2A to 2C show the case where the first ferromagnetic is a pinned layer, processes similar to those described above will be used in the case where the first ferromagnetic is a free layer. It is needless to say that the magnetic conduction column 5b in this case comprises a part of constituent elements of the free layer.

The above describes the case where the intermediate layer 5 is formed prior to deposition of the free layer. Hereinafter, the case where the intermediate layer 5 is formed after the free layer is deposited will be described with reference to FIGS. 3A and 3B.

The processes of (1) and (2) are the same as the above processes.

(3') Formation of the Intermediate Layer 5 and Free Layer 6:

Like FIG. 2A, a metal layer 9 made of a metal such as Al to be converted into the oxide layer is deposited on the upper pinned layer 4c. Like FIG. 2B, the metal layer (Al) 9 is oxidized by natural exposure, an ion-assisted method, a RF plasma method, an ion-beam method or a radical method by which the oxide layer 5a and the magnetic conduction column 5b penetrating the oxide layer 5a in the thickness direction and comprising at least a part of constituent elements of the upper pinned layer 4c are formed. At this time, it is not necessary to heat the substrate, and the oxidation can be performed at room temperature.

In the embodiment, the oxidation conditions are made more moderate compared to proper or excessive oxidation conditions under which the entire metal layer (Al) 9 is oxidized, and thus, unoxidized metal (Al) 9a is made remained in the oxide layer 5a. The more moderate oxidation conditions compared to proper or excessive oxidation conditions can be attained by reducing the oxygen flow rate, reducing the oxygen pressure, or shortening the oxidation time. The quantity of the remaining unoxidized metal can be changed by adjusting the above conditions and by adjusting the thickness of the metal layer (Al) 9.

Also, the oxide layer 5a in which unoxidized metal (Al) 9a is remained may be subjected to a RF plasma method or an ion-beam method to form the magnetic conduction column 5b.

Figure 3A:
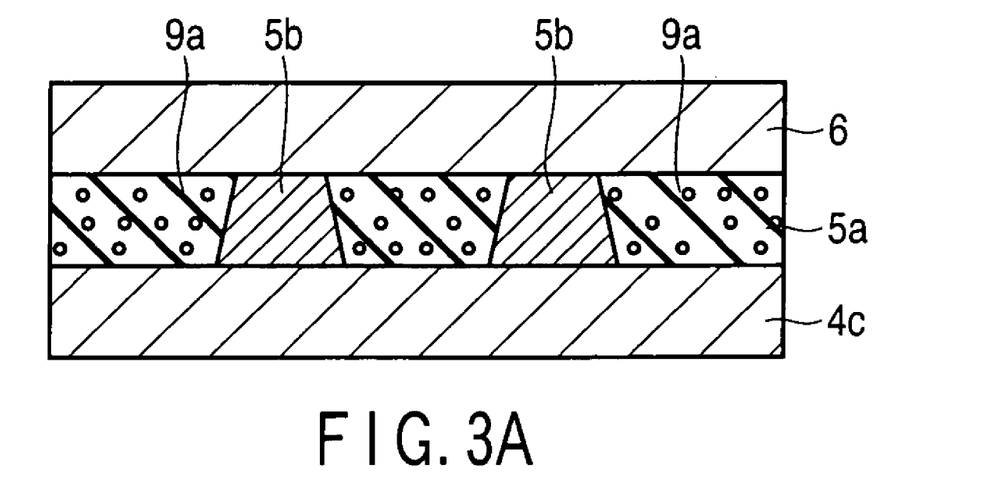
FIGS. 3A and 3B are cross-sectional views showing another method of manufacturing the magnetoresistive element shown in FIG. 1.

Then, as shown in FIG. 3A, the free layer 6 is deposited on the oxide layer 5a, in which unoxidized metal (Al) 9a is remained, and the magnetic conduction column 5b.

Figure 3B:
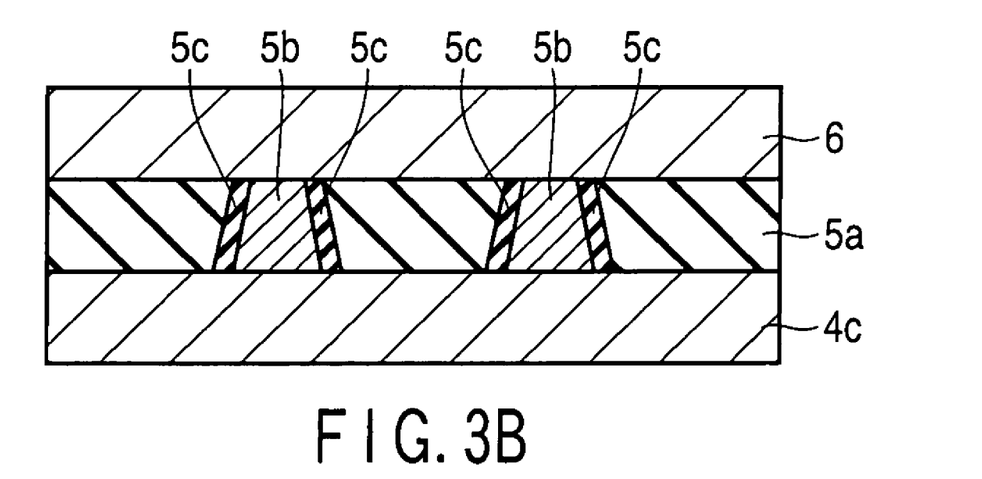

As shown in FIG. 3B, after the free layer 6 is formed, the resultant structure is annealed in vacuum at a higher temperature than the oxidation temperature to convert a part of the periphery of the magnetic conduction column 5b (in-situ annealing), thereby to form the magnetic oxide 5c comprising a part of constituent elements of the oxide layer 5a and at least a part of constituent elements of the magnetic conduction column 5b. Thus, the intermediate layer 5 comprising the oxide layer 5a, magnetic conduction column 5b and magnetic oxide 5c is formed. In this case, the constituent elements of the magnetic conduction column 5b may be mainly comprised of the constituent elements of the free layer or may be the constituent elements of the upper pinned layer mixed with the constituent elements of the free layer.

In the case where $Fe_{50}Co_{50}$, for example, is used for the material of the upper pinned layer 4c, FeCo, Fe, Co, FeCo-oxide and the like are present in the magnetic conduction column 5b at the end of the oxidation, a supplemental process performed if necessary for forming the magnetic conduction column 5b and the deposition of the $Fe_{50}Co_{50}$ free layer. When the annealing is performed in this state, the FeCo-oxide is react with the unoxidized metal (Al) with the Fe element supplied from the free layer to produce FeAl-oxide and Co through reduction. As a result, the magnetic conduction column 5b is highly purified in a composition mainly comprised of Co and the FeAl-oxide covers at least a part of the periphery of the magnetic conduction column 5b and reduces the size of magnetic conduction column 5b. The annealing temperature is set at a higher temperature than the oxidation temperature so as to cause above reaction. The upper limits of the annealing conditions are determined in a range of temperature and time where no diffusion is caused at the interfaces of the layers. The temperature at which the diffusion is caused at the interfaces of the layers is not specifically determined because it depends on a degree of mixing at the interfaces of the layers after deposition and surface irregularity.

It should be noted that the material of the upper pinned layer 4c or free layer 6 is preferably made of an alloy comprising Fe which is easily oxidized and Co or Ni which is hard to be oxidized like the above example.

(4') Formation of the Protection Layer 7 and Upper Electrode (UE) 8:

The protection layer 7 and the upper electrode (UE) 8 are deposited in this order on the free layer 6. In such a manner, the magnetoresistive element can be provided.

(5) Annealing in a Magnetic Field:

The resultant magnetoresistive element is annealed in a magnetic field by which the magnetization direction of the pinned layer 4 is pinned.

Although FIGS. 3A and 3B show the case where the first ferromagnetic is a pinned layer, processes similar to those described above will be used in the case where the first ferromagnetic is a free layer. The magnetic conduction column 5b in this case comprises both the constituent elements of the free layer and pinned layer or a part of constituent elements of the pinned free layer.

A magnetic head assembly and an HDD using the above magnetoresistive element will now be described.

Figure 4:
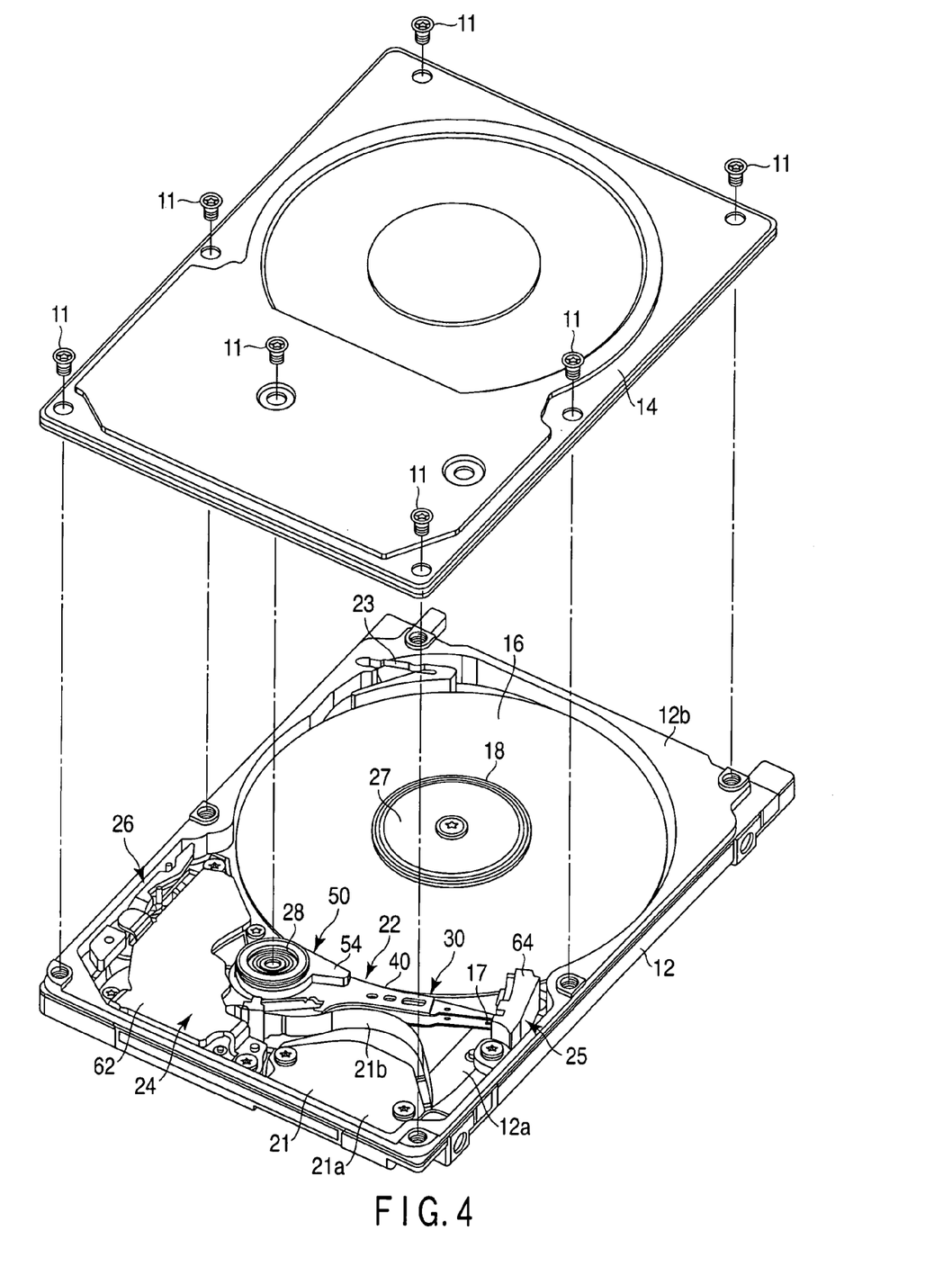
FIG. 4 is an exploded perspective view of a magnetic recording apparatus according to an embodiment with its top cover off.

FIG. 4 is a perspective view showing the internal structure of the HDD with its top cover off. As shown in FIG. 4, the HDD is provided with a housing 10. The housing 10 includes a base 12 in the form of an open-topped rectangular box and a top cover 14, which is fastened to the base with screws 11 so as to close the top opening of the base. The base 12 includes a rectangular bottom wall 12a and a sidewall 12b set up along the peripheral edge of the bottom wall.

The housing 10 contains one magnetic disk 16 for use as a recording medium and a spindle motor 18 as a drive section that supports and rotates the magnetic disk. The spindle motor 18 is located on the bottom wall 12a. The housing 10 has a size large enough to accommodate a plurality of, e.g., two, magnetic disks, and the spindle motor 18 is configured to support and drive two magnetic disks.

The housing 10 further contains magnetic heads 17, head stack assembly (HSA) 22, voice coil motor (VCM) 24, ramp load mechanism 25, latch mechanism 26, and board unit 21.

The magnetic heads 17 record and reproduce information to and from the magnetic disk 16. The HSA 22 supports the heads 17 for movement with respect to the disk 16. The VCM 24 swings and positions the HSA 22. The ramp load mechanism 25 holds the magnetic heads in a retracted position at a distance from the magnetic disk when the heads are moved to the outermost periphery of the disk. The latch mechanism 26 holds the HSA in its retracted position when the HDD is jolted. The board unit 21 includes a preamplifier and the like. A printed circuit board (not shown) is screwed to the outer surface of the bottom wall 12a of the base 12. The circuit board controls the operations of the spindle motor 18, VCM 24, and magnetic heads through the board unit 21. A circulation filter 23 is disposed on the sidewall of the base 12 and situated outside the magnetic disk 16. The filter 23 captures dust that is produced in the housing when any moving part is operated.

The magnetic disk 16 is formed with a diameter of, for example, 65 mm (2.5 inches) and has magnetic recording layers on its upper and lower surfaces, respectively. The disk 16 is coaxially fitted on a hub (not shown) of the spindle motor 18 and clamped and fixed on the hub by a clamp spring 27. Thus, the disk 16 is supported parallel to the bottom wall 12a of the base 12. The disk 16 is rotated at a predetermined speed of, for example, 5,400 or 7,200 rpm by the spindle motor 18.

Figure 5:
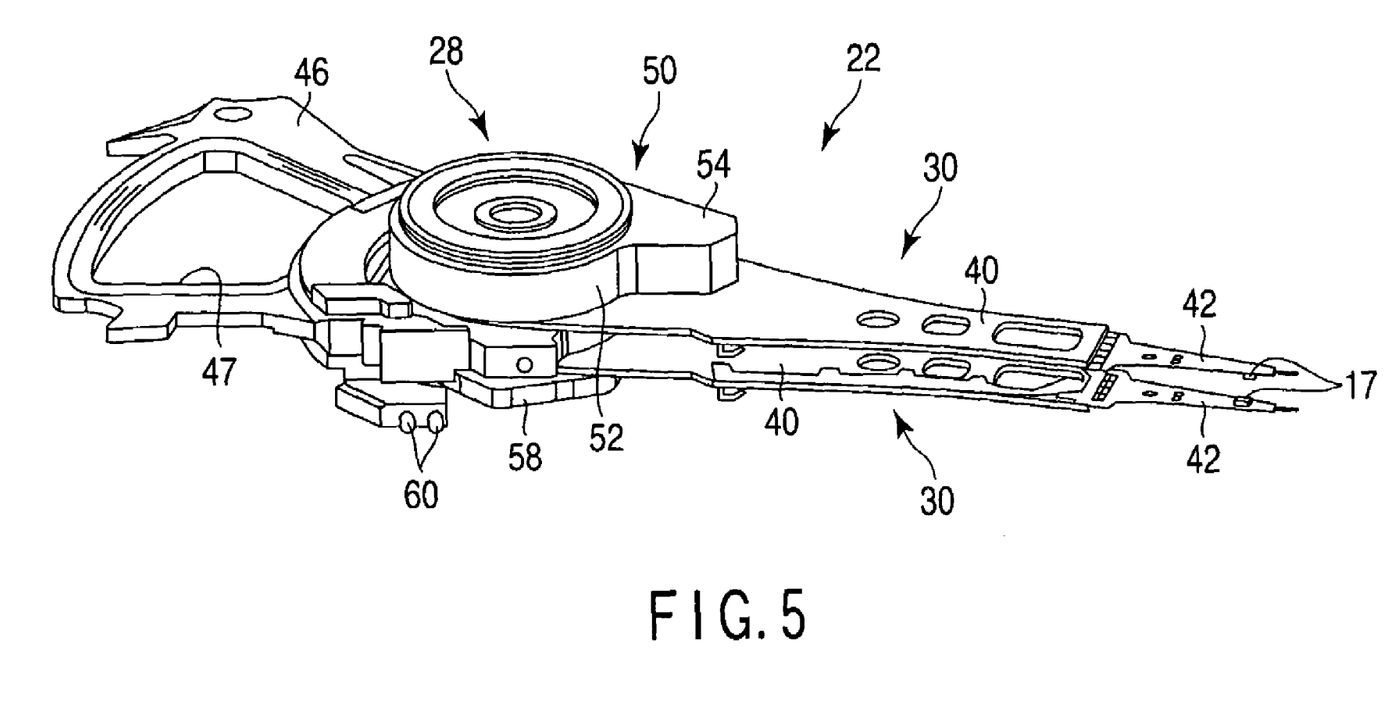
FIG. 5 is a perspective view of a magnetic head stack assembly in the HDD in FIG. 4.
Figure 6:
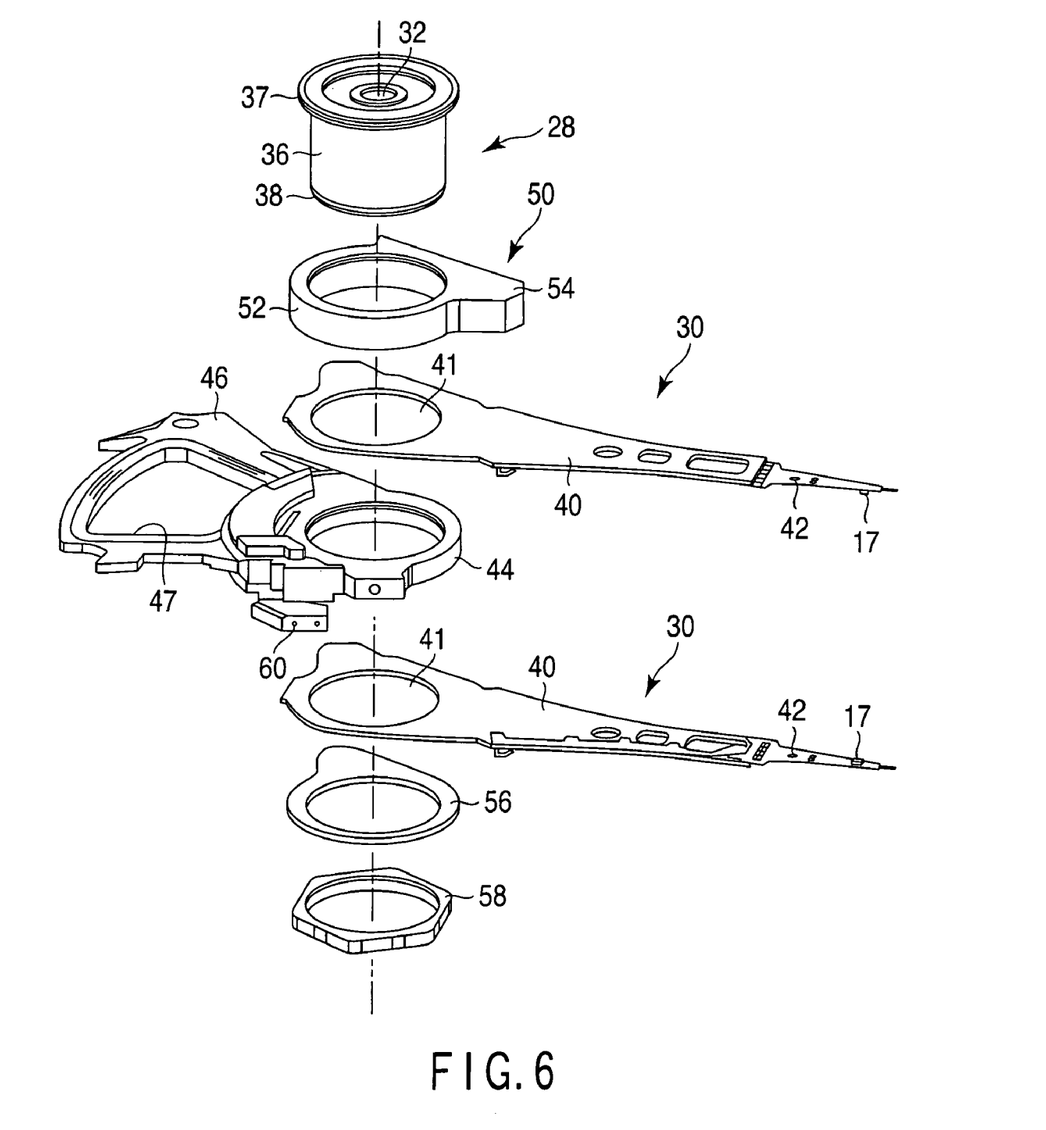
FIG. 6 is an exploded perspective view of the magnetic head stack assembly in FIG. 6.

FIG. 5 is a perspective view showing the HSA 22, and FIG. 6 is an exploded perspective view of the HSA. As shown in FIGS. 5 and 6, the HSA 22 is provided with a rotatable bearing portion 28, two head gimbal assemblies (HGAs) 30 extending from the bearing portion, a spacer ring 44 laminated between the HGAs, and a dummy spacer 50.

The bearing portion 28 is situated apart from the center of rotation of the magnetic disk 16 along the length of the base 12 and near the outer peripheral edge of the disk. The bearing portion 28 includes a pivot 32 set up on the bottom wall 12a of the base 12 and a cylindrical sleeve 36 coaxially supported for rotation on the pivot by a bearing 34. An annular flange 37 is formed on the upper end of the sleeve 36, while a thread portion 38 is formed on the outer periphery of its lower end portion. The sleeve 36 of the bearing portion 28 is formed with such a size, or an axial length in this case, that four HGAs at the most, for example, and spacers between adjacent pairs of HGAs can be mounted in a stack.

Since the magnetic disk 16 is set to be one in number in the present embodiment, the bearing portion 28 is provided with two HGAs 30, the number of which is smaller than four, the maximum mountable number, by two. Each HGA includes an arm 40 extending from the bearing portion 28, a suspension 42 extending from the arm, and the magnetic head 17 supported on an extended end of the suspension by a gimbal portion.

The arm 40 is a thin flat plate formed by laminating, for example, stainless steel, aluminum, and stainless steel layers to one another. A circular through hole 41 is formed on one end or proximal end of the arm 40. The suspension 42 is formed of an elongated leaf spring, and its proximal end is fixed to the distal end of the arm 40 by spot welding or adhesive bonding and extends from the arm. The suspension 42 and the arm 40 may be formed integrally of the same material.

The magnetic head 17 includes a substantially rectangular slider and a write head and a CPP-GMR read head formed on the slider and is fixed to the gimbal portion formed on the distal end portion of the suspension 42. Further, the magnetic head 17 includes four electrodes (not shown). A relay flexible printed circuit board (a relay FPC, not shown) is set on the arm 40 and the suspension 42. The magnetic head 17 is electrically connected to a main FPC 21b through the relay FPC.

The spacer ring 44 is formed of aluminum or the like having a predetermined thickness and a predetermined outer diameter. A plastic support frame 46 is molded integrally with the spacer ring 44 and extends outward from the spacer ring. A voice coil 47 of the VCM 24 is fixed to the support frame 46.

The dummy spacer 50 includes an annular spacer body 52 and a balancing portion 54 extending from the spacer body and is integrally formed of a metal such as stainless steel. The outer diameter of the spacer body 52 is equal to that of the spacer ring 44. More specifically, the outer diameter of that part of the spacer body 52 which contacts the arm 40 is equal to that of that part of the spacer ring 44 which contacts the arm. Further, a thickness T1 of the spacer body 52 is equal to the sum of those of the arms of the smaller number of HGAs than the maximum, that is, the two arms, and the spacer ring arranged between these arms.

The dummy spacer 50, the two HGAs 30, and the spacer ring 44 are fitted on the sleeve 36 of the bearing portion 28 that is passed through the bore of the spacer body 52, the through hole 41 of the arm 40, and the bore of the spacer ring, and are stacked on the flange 37 along the axis of the sleeve. The spacer body 52 of the dummy spacer 50 and the spacer ring 44 are fitted on the sleeve 36 in such a manner that they are sandwiched between the flange 37 and one of the arms 40 and between the two arms 40, respectively. Further, an annular washer 56 is fitted on the lower end portion of the sleeve 36.

The dummy spacer 50, two arms 40, spacer ring 44, and washer 56 that are fitted on the sleeve 36 are sandwiched between the flange 37 and a nut 58, which is threadedly fitted on the thread portion 38 of the sleeve 36, and are fixedly held on the outer periphery of the sleeve.

The two arms 40 are individually located on predetermined positions with respect to the circumference of the sleeve 36 and extend in the same direction from the sleeve. Thus, the two HGAs can be swung integrally with the sleeve 36 and extend parallel to the surfaces of the magnetic disk 16 so as to face each other with predetermined spacing. Further, the support frame 46 that is integral with the spacer ring 44 extends in the opposite direction to the arms 40 from the bearing portion 28. Two pin-like terminals 60 protrude from the support frame 46 and are electrically connected to the voice coil 47 through a wire (not shown) that is embedded in the frame 46.

EXAMPLES

Example 1

In this example, a magnetoresistive element was manufactured as described below.

First, respective layers from the underlayer 2 to the upper pinned layer 4 were formed on the lower electrode (LE) 1 using the flowing materials.
Underlayer 2: Ta [5 nm]/Ru [2 nm],
Anti-ferromagnetic layer 3: IrMn [7 nm],
Lower pinned layer 4a: $Co_{90}Fe_{10}$ [3.3 nm],
Anti-parallel coupling layer 4b: Ru [0.9 nm],
Upper pinned layer 4c: $Fe_{50}Co_{50}$ [2.5 nm].

Next, an Al film [0.9 nm] as the metal layer 9 to be converted into the oxide layer was deposited on the upper pinned layer 4c. After the deposition of the Al film [0.9 nm], Ar ions were applied to the surface of the Al film while introducing oxygen in the chamber at room temperature. After introducing oxygen was stopped, Ar ions were further applied to the surface of the Al film. In such a manner, the oxide layer 5a and the magnetic conduction column 5b penetrating the oxide layer 5a in the thickness direction and comprising at least a part of constituent elements of the upper pinned layer 4c were formed.

The oxidation conditions in this process were lower oxygen exposure conditions with a reduced oxygen flow rate or a shortened oxidation time compared to proper (or excessive) oxidation conditions for oxidizing the entire metal layer (Al) 9, and thus, the Al film was not oxidized entirely.

Another sample was prepared in such a manner that a structure was provided by stopping the processes at this stage and the protection layer was deposited on the oxide layer. The test sample was analyzed by X-ray photoelectron spectroscopy (XPS), with a result that unoxidized Al was remained in the oxide layer 5a.

Then, the resultant structure was annealed at 200 to 300° C. for 30 minutes (in-situ annealing) to form the magnetic oxide 5c comprising a part of constituent elements of the oxide layer 5a and at least a part of constituent elements of the magnetic conduction column 5b so as to cover a part of the magnetic conduction column 5b, by which the intermediate layer 5 comprising the oxide layer 5a, magnetic conduction column 5b and magnetic oxide 5c was formed.

Further, the free layer 6 and protection layer 7 were formed using the following materials, respectively, and then the upper electrode (UE) 8 was formed.

Free layer 6: $Fe_{50}Co_{50}$ [2.5 nm],
Protection layer 7: Cu [1 nm]/Ta [2 nm]/Ru [15 nm].

The resultant magnetoresistive element was annealed in a magnetic field at 290° C. for approximately one hour in order to fix the magnetization direction of the pinned layer 4.

Figure 7:
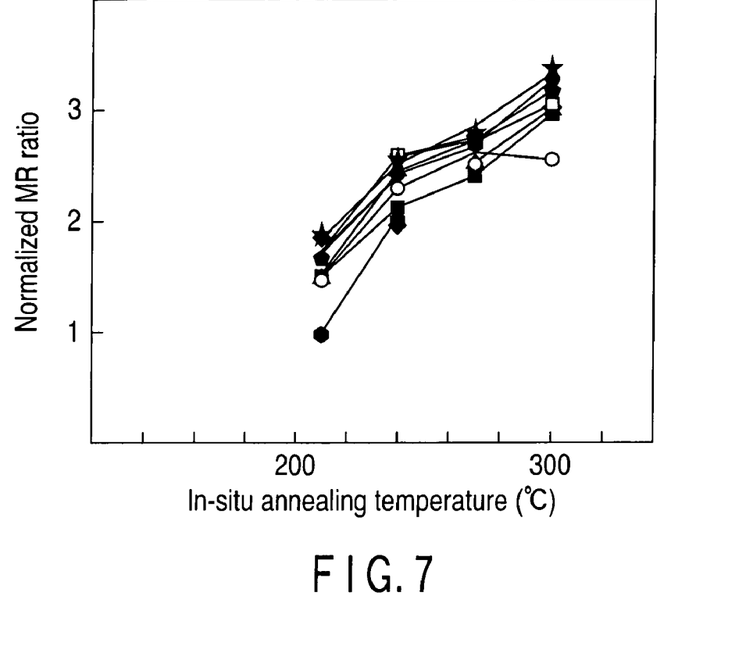
FIG. 7 is a graph showing the relationship between the in-situ annealing temperature and MR ratio for the magnetoresistive element in Example 1.

FIG. 7 is a graph showing the relationship between the in-situ annealing temperature and MR ratio with respect to several magnetoresistive elements manufactured in Example 1. FIG. 7 shows that the magnetoresistive elements in Example 1 exhibited improved MR ratio as the in-situ annealing temperature was raised in the range of 200 to 300° C.

Figure 8:
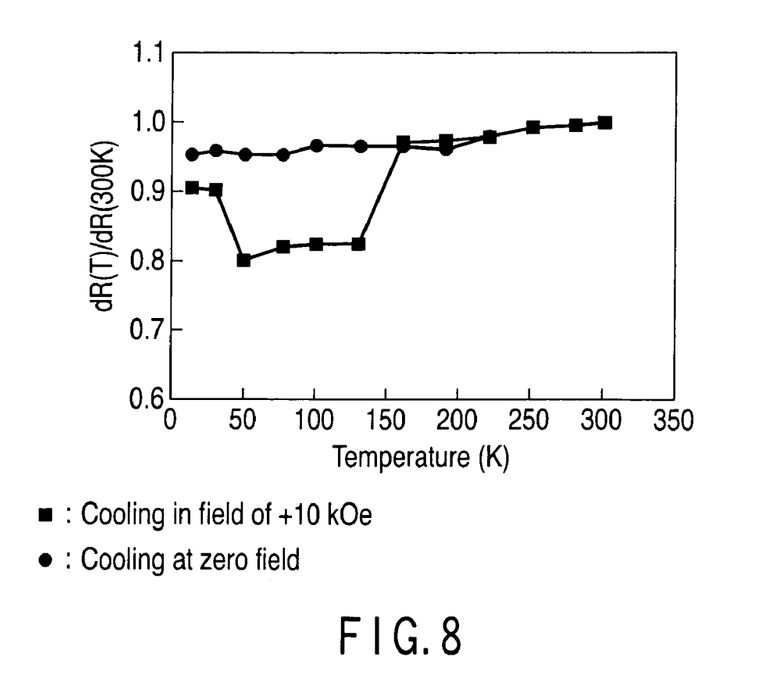
FIG. 8 is a graph showing the temperature dependence of the resistance change for the magnetoresistive element in Example 1.

Further, the following experiment was performed to confirm the presence of magnetic oxide in the resultant magnetoresistive element. The magnetoresistive element was examined for the temperature dependence of the resistance change in the case where the element was cooled to 15 K while applying a field of +10 kOe in such a direction as to reverse the magnetization of the upper pinned layer in the pinned layer of the lower pinned layer, Ru layer and upper pinned layer and in the case where the element was cooled to 15 K at zero field, respectively. FIG. 8 shows the temperature dependence of the resistance change, dR(T)/dR(300 K).

As shown in FIG. 8, in the case where the magnetoresistive element was cooled to 15 K while applying a field of +10 kOe, the resistance change was decreased abruptly at approximately 150 K. This means that a magnetic oxide with a magnetic transition point at approximately 150 K exists in the magnetoresistive element. In this Example, a magnetoresistive ratio of 50% or more was obtained for an area resistance (RA) of 0.3 $\Omega\mu m^2$.

Although the above Example describes the case where the in-situ annealing was performed prior to the deposition of the free layer, the similar result to the above Example was also obtained in the case where the in-situ annealing was performed after the deposition of the free layer. In the case where the in-situ annealing is performed after the deposition of the free layer, a free layer in a stacked structure of $Fe_{50}Co_{50}/Co_{90}Fe_{10}$ may be used.

Further, another magnetoresistive element was manufactured using the following materials:

Underlayer 2: Ta [5 nm]/Ru [2 nm],
Anti-ferromagnetic layer 3: IrMn [7 nm],
Lower pinned layer 4a: $Co_{90}Fe_{10}$ [3.3 nm],
Anti-parallel coupling layer 4b: Ru [0.9 nm],
Upper pinned layer 4c: $Fe_{50}Co_{50}$ [2.5 nm],
Metal layer 9: Al [1.5 nm],
Free layer 6: $Fe_{50}Co_{50}$ [0.3 nm]/Cu [0.3 nm]/$Fe_{50}Co_{50}$ [4.7 nm],
Protection layer 7: Cu [1 nm]/Ta [2 nm]/Ru [15 nm].

The resultant magnetoresistive element exhibited similar results to those of the Example described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a magnetoresistive element comprising:
   forming a metal layer on a first ferromagnetic layer;
   oxidizing the metal layer at a temperature to form an oxide layer in which unoxidized metal remains and a magnetic conduction column penetrating the oxide layer in a thickness direction and comprising at least a part of constituent elements of the first ferromagnetic layer;
   annealing a resultant structure at a higher temperature than the temperature at which the oxide layer is formed to convert at least a part of a periphery of the magnetic conduction column into a magnetic oxide comprising a part of constituent elements of the oxide layer and at least a part of constituent elements of the magnetic conduction column; and
   forming a second ferromagnetic layer.

2. The method according to claim 1, wherein oxidizing the metal layer to form the oxide layer and the magnetic conduction column comprises applying an ion beam or RF plasma of a rare gas to the metal layer while supplying an oxidizing gas.

3. The method according to claim 1, wherein oxidizing the metal layer to form the oxide layer and the magnetic conduction column comprises applying an ion beam or RF plasma of a rare gas to the metal layer while supplying an oxidizing gas and further comprising applying the ion beam or RF plasma of the rare gas to the oxidized metal layer without supplying the oxidizing gas.

4. A magnetoresistive element comprising:
   a stacked film comprising first and second ferromagnetic layers, a magnetization direction of one of which ferromagnetic layers is substantially pinned in a direction and a magnetization direction of the other of which ferromagnetic layers is varied depending on an external magnetic field, and an intermediate layer between the first and second ferromagnetic layers; and
   a pair of electrodes provided on a bottom and a top of the stacked film and configured to pass a current perpendicularly to a film plane of the stacked film,
   the intermediate layer comprising: an oxide layer; a magnetic conduction column penetrating the oxide layer in a thickness direction; and a magnetic oxide covering at least a part of a periphery of the magnetic conduction column and comprising a part of constituent elements of the oxide layer and at least a part of constituent elements of the magnetic conduction column.

5. The magnetoresistive element according to claim 4, wherein the first and second ferromagnetic layers comprise at least one element selected from the group consisting of Fe, Co and Ni.

6. The magnetoresistive element according to claim 4, wherein the oxide layer comprises Al as a metal element.

7. A magnetic head assembly comprising the magnetoresistive element according to claim 4.

8. A magnetic recording apparatus comprising a magnetic recording medium and the magnetic head assembly according to claim 7.

9. The method according to claim 1, wherein the magnetic oxide covers the periphery of the magnetic conduction column.

10. The magnetoresistive element according to claim 4, wherein the magnetic oxide covers the periphery of the magnetic conduction column.

* * * * *